United States Patent
Kido et al.

(10) Patent No.: US 7,638,804 B2
(45) Date of Patent: Dec. 29, 2009

(54) SOLID-STATE IMAGING DEVICE AND IMAGING APPARATUS

(75) Inventors: Hideo Kido, Kanagawa (JP); Hiroaki Ishiwata, Tokyo (JP)

(73) Assignee: Sony Corporation, Tokyo (JP)

(*) Notice: Subject to any disclaimer, the term of this patent is extended or adjusted under 35 U.S.C. 154(b) by 25 days.

(21) Appl. No.: 11/725,029

(22) Filed: Mar. 16, 2007

(65) Prior Publication Data

US 2007/0215912 A1    Sep. 20, 2007

(30) Foreign Application Priority Data

Mar. 20, 2006 (JP) ............................ P2006-076693

(51) Int. Cl.
*H01L 31/0203* (2006.01)

(52) U.S. Cl. .................. 257/59; 257/435; 257/434; 257/440

(58) Field of Classification Search ................ 257/59, 257/434, 435, 440
See application file for complete search history.

(56) References Cited

U.S. PATENT DOCUMENTS

2003/0122209 A1* 7/2003 Uya ........................... 257/435
2005/0139750 A1* 6/2005 Dobashi et al. ............ 250/208.1
2005/0236553 A1* 10/2005 Noto et al. ................. 250/208.1

FOREIGN PATENT DOCUMENTS

| JP | 63-100879 | 5/1998 |
| JP | 2003-273342 | 9/2003 |
| JP | 2004-128193 | 4/2004 |

* cited by examiner

*Primary Examiner*—Long Pham
(74) *Attorney, Agent, or Firm*—Robert J. Depke; Rockey, Depke & Lyons, LLC

(57) ABSTRACT

A solid-state imaging device is disclosed. In the solid-state imaging device, plural unit areas, each having a photoelectric conversion region converting incident light into electric signals are provided adjacently, in which each photoelectric conversion region is provided being deviated from the central position of each unit area to a boundary position between the plural unit areas, a high refractive index material layer is arranged over the deviated photoelectric conversion region, and a low refractive index material layer is provided over the photoelectric conversion regions at the inverse side of the deviated direction being adjacent to the high refractive index material layer, and optical paths of the incident light are changed by the high refractive index material layer and the low refractive index material layer, and the incident light enters the photoelectric conversion region.

9 Claims, 9 Drawing Sheets

US 7,638,804 B2

SOLID-STATE IMAGING DEVICE AND IMAGING APPARATUS

CROSS REFERENCE TO RELATED APPLICATIONS

The present invention contains subject matter related to Japanese Patent Application JP 2006-076693 filed in the Japanese Patent Office on Mar. 20, 2006, the entire contents of which being incorporated herein by reference.

BACKGROUND OF THE INVENTION

1. Field of the Invention

The present invention relates to a solid-state imaging device having a photoelectric conversion means and the like, particularly, relates to a solid-state imaging device and an imaging apparatus including an optical path changing means.

2. Description of the Related Art

Recently, video cameras and electronic cameras are widely used. In these cameras, an amplifying solid-state imaging device such as a CCD (Charge Coupled Device) solid-state imaging device or a CMOS (Complementary Metal Oxide Semiconductor) image sensor is used. In an imaging unit of the solid-state imaging device, plural photoelectric conversion regions formed by photo diodes are arranged in a two dimensional array, and a unit area (unit pixel) is formed by taking each photoelectric conversion region as a central function unit.

In the CCD solid-state imaging device, light entering each unit pixel is photoelectrically converted by the photo diode, and generated signal charges are transferred to a floating diffusion (FD) region provided at an output unit through a vertical CCD transfer register and a horizontal CCD transfer register. Then, potential change in the FD region is detected and amplified by a MOS transistor to be outputted as an imaging signal.

On the other hand, the CMOS image sensor includes the FD region, various MOS transistors for transfer, amplification and the like in each unit pixel, which can be operated in lower voltage than the CCD solid-state imaging device and complicated signal processing functions can be easily integrated in one chip, therefore, it is suitable for miniaturization and power saving of the imaging device.

FIG. 6 is an explanatory diagram showing a configuration of an imaging unit of a CMOS image sensor of a related art and an example of an equivalent circuit of one unit pixel. In the CMOS image sensor shown in FIG. 6, a photoelectric conversion region formed by a photo diode 102, four MOS transistors 103, and 105 to 107 for converting signal charges into voltage signals to be outputted are provided in each unit pixel 100.

At the time of light-receiving operation, signal charges (electrons) accumulated in the photo diode 102 are transferred to a floating diffusion (FD) region 104 through a charge transfer gate 103 based on a read-out pulse applied to a gate electrode of the charge transfer gate 103 from a read-out signal line 109. The FD region 104 is connected to a gate electrode of the amplifying transistor 105, and potential change of the FD region 104 by signal charges (electrons) is impedance-converted into a voltage signal to be outputted to a vertical signal line 15. A vertical selecting transistor 106 is turned on and off based on a vertical selection pulse applied to a gate electrode from a vertical selection line 13, performs a function of driving the amplifying transistor 105 for a prescribed period. A reset transistor 107 performs a function of resetting the potential in the FD region 104 to the potential of a power source line 108 based on a vertical reset pulse applied to a gate electrode from a vertical reset line 14.

Each unit pixel 100 is scanned once during a cycle by a vertical scanning circuit 11 and a horizontal scanning circuit 12 as described below. Specifically, the vertical selection pulse is outputted to one vertical selection line 13 from the vertical scanning line 11 for a prescribed period in a cycle, and pixels in a row corresponding to the vertical selection line 13 are selected, and output signals of respective pixels are outputted to each vertical signal line 15. Then, a horizontal selection pulse is sequentially outputted to each horizontal selection line 17 from the horizontal scanning circuit 12, and an output signal of each corresponding vertical signal line 15 is sequentially extracted to the horizontal signal line 18 through a horizontal selecting transistor 16. When scanning of all pixels in one row is finished, the vertical selection pulse is outputted to the vertical selection line 13 of a next row, and respective pixels of the new row are scanned in the same way as the above. By repeating the above operation, all pixels in all rows are scanned once during a cycle, and output signals are extracted to the horizontal signal line 18 in time series.

FIG. 7A is a cross-sectional view showing a configuration of an imaging unit of a CMOS image sensor of a related art. FIG. 7B is an explanatory diagram schematically showing the correspondence between the FD region 104 and peripheral impurity layers, which is difficult to be shown only by the cross-sectional view of FIG. 7A.

As shown in FIG. 7A, photoelectric conversion regions 102 made of embedded photodiodes are formed in a p-type silicon substrate 101. At the periphery thereof, an n-type impurity layer forming MOS transistors such as the charge transfer gate 103 is formed. As shown in FIG. 7B, the n-type impurity layer in which the embedded photodiode 102, the FD region 104 and the reset transistor 107 are formed is provided so as to be connected by a channel region under the gate electrode, which enables efficient transfer and deletion of signal charges.

If light leaks into a circuit unit formed by the MOS transistors, photoelectric conversion occurs and a pseudo signal is generated by electrons thus generated, which becomes noise. Therefore, generally, a not-shown light shielding film is arranged for shielding the active region from incident light so that light does not enter the active region.

Over the silicon substrate 101, multilayer wiring made of, for example, aluminum and the like is formed through an insulating layer 124 made of silicon oxide and the like. In the multilayer wiring, for example, wiring 121 as a first layer is local wiring connecting between pixel transistors, wiring 122 as a second layer and wiring 123 as a third layer are global wiring which are control signal lines such as the vertical selection line 13 driving the transistors, signal lines such as the vertical signal line 15 transmitting electric signals amplified by the amplifying transistor 105, the power source line and the like.

The multilayer wiring forms a region shielding incident light in the unit pixel. Therefore, in order to introduce light as much as possible into the photodiode 102, it is necessary to improve the opening ratio of the photodiode 102, therefore, wiring is laid out so as not to be arranged over the photodiode 102.

Further over the layer, a passivation film 125 made of silicon nitride and the like, a planarizing film and the like are formed, and pixel color filters 126 and on-chip lenses 127 are disposed thereon. The on-chip lenses 127 and intra lenses are provided for allowing incident light to avoid regions at which incident light is shielded, and for collecting incident light at the photodiodes 102. Usually, the on-chip lenses and the intra lenses are formed at a fixed pitch of equal intervals.

In the above CMOS image sensor, relative positional relationship of the photodiode 102, the pixel transistors 103, 105 to 107, wiring in the pixel, the on-chip lens 127 and the intra lens in the unit pixel is common in each unit pixel. That is, respective members are arranged at the same pitch of equal intervals so as to have the same translational symmetry. As a result, incident light enters the photodiode 102 at each unit pixel in the same way, and good quality images with small variation in each unit pixel can be obtained.

In the amplifying solid-state imaging device such as the CMOS image sensor, multilayer wiring having at least two layers, preferably three layers or more is necessary as in the above, therefore, a configuration formed over the photodiode 102 becomes thick. For example, the height from the surface of the photodiode 102 to the top third wiring is up to 3 to 5 μm, which is approximately the same as the pixel size. Accordingly, in a solid-state imaging apparatus which takes images by focusing a subject by a lens, there is a problem that shading is large in a region near the periphery of an imaging area, that is, a problem that light entering obliquely is shielded by the shielding film or wiring, consequently, the amount of light collected at the photodiodes is reduced, as a result, deterioration of image quality becomes obvious.

Consequently, in the region near the periphery of the imaging area, positions of the on-chip lenses and openings in the shielding film are corrected, which is called as an eye correction, so that the obliquely entering light is also collected at the photodiodes to reduce the shading. Specifically, the on-chip lenses and the openings of the shielding film are arranged in the direction from which light enters, seen from the photodiodes. In JP-A-2003-273342 (pp. 3-5, FIG. 1 and FIG. 10) (patent document 1), a solid-state imaging device is proposed, in which relative positions of signal lines (wiring) with respect to respective unit pixels are shifted in the direction coming close to the center of the imaging area as they are coming close from the center to the periphery in the imaging area.

The important thing relating to the invention is that, in the solid-state imaging device such as the CMOS image sensor, the photoelectric conversion region (photodiode) is usually arranged at the central position of the unit area (unit pixel) and each pixel lens of the on-chip lens is designed so that transmitting light is collected in the central position of the unit pixel, including the example in which the above correction is performed at the periphery of the imaging area. Speaking more generally, the photoelectric conversion region is usually arranged in a fixed position (central position in the above example) in the unit area, and respective photoelectric conversion regions are arranged at a fixed pitch of equal intervals so as to have the same translational symmetry as the arrangement of the unit area, as well as respective pixel lenses forming the on-chip lenses are arranged so as to have the translational symmetry at the same or almost the same pitch as the photoelectric conversion regions.

The unit area (unit pixel) in the present specification denotes an area on a substrate in which a part for realizing the function of one photoelectric conversion region as the central function region is arranged. The translational symmetry in the arrangement of the unit area represents the regularity of arrangement formed by assembly of points occupying a fixed position (for example, a central position) in the unit area having the same size.

Recently, demand for miniaturization of the solid-state imaging device increases for the purpose of installing a camera function to mobile equipment such as cellular phones. A problem is arising, in which a light-receiving area in each unit pixel decreases with the miniaturization of the solid-state imaging device and the miniaturization of the unit pixel according to the increase of the number of pixels, and characteristics of the solid-state imaging device such as the saturated signal amount and sensitivity deteriorate.

In related arts, in order to prevent the deterioration of characteristics, a method of suppressing decrease of the area of the photodiode by decreasing the area of transistors in the unit pixels and the like are used. However, there are limitations to keep characteristics of the solid-state imaging device by such methods.

Consequently, in JP-A-63-100879 (page 5, FIG. 4) and JP-A-2004-128193 (pp. 5-8, FIG. 2) (patent documents 2 and 3), as a breakthrough for a next generation, a CMOS image sensor is proposed, in which the FD region 104, the amplifying transistor 105, the vertical selecting transistor 106, and the reset transistor 107 provided at all pixels in related arts other than the photodiode 102 and the charge transfer gate 103 which are fundamental for each pixel, are shared between plural adjacent unit pixels. In the CMOS image sensor, the number of transistors and wiring at each unit pixel can be decreased, as a result, the sufficient area for the photodiode can be secured and shading by wiring can be reduced, therefore, it is expected that the CMOS image sensor is efficiently responsive to the miniaturization of the unit pixel.

SUMMARY OF THE INVENTION

As an example of the above, it is possible to form a CMOS image sensor, as described later with reference to FIG. 1 to 3 in Embodiment 1 of the invention, in which an FD region 4 which is common to two or four unit pixels is provided, and an amplifying transistor 5, a vertical selecting transistor 6 and a reset transistor 7 are shared between adjacent unit pixels to decrease the number of transistors and wiring at each unit pixel.

However, in this case, both the photodiode 2 specific to each pixel and the common region shared by plural unit pixels exist in a unit pixel. The relative position occupied by the common region in the unit pixel certainly differs between adjacent unit pixels, therefore, the relative position occupied by the photo diode 2 in the unit pixel will differ between adjacent unit pixels naturally. Namely, in the CMOS image sensor having the common regions, it is difficult to arrange the photo diodes 2 at the same pitch so as to have the same translational symmetry as the unit pixels, which differs from the usual CMOS image sensor in the related arts (refer to FIG. 7A and FIG. 7B). Hereinafter, these matters and problems in a case in which on-chip lenses similar to the related arts are formed on such substrate will be explained.

FIG. 8 is a cross-sectional view showing a configuration of an imaging area of a CMOS image sensor in which on-chip lenses 27, intra lenses 131 and the like which are similar to the related arts are formed on a silicon substrate 1 on which the photodiodes 2 and transistors are formed. In FIG. 8, three unit pixels are chiefly shown, and a unit pixel 10 at the left and a unit pixel 20 in the middle share the FD region 4 at a boundary position 31, however, a unit pixel 60 at the right and the unit pixel 20 in the middle do not share the FD region 4.

As already described with reference to FIG. 7B, an n-type region of the photodiode 2 and an n-type region of the FD region 4 are provided so as to be connected through a channel region of the charge transfer gate 3 for efficient transfer of signal charges. Therefore, the photoelectric conversion region 2 is provided so as to be deviated to the side of the FD region 4 (the side of the boundary position 31) from the central position in the unit pixel. In the vicinity of a boundary position 32 at the opposite side of the boundary position 31, (not shown) the amplifying transistor, the vertical selecting transistor or the reset transistor and the like which are shared between pixels are formed.

According to the above, the arrangement formed by the photodiodes 2 in respective unit pixels in a lateral direction in FIG. 8 is the arrangement in which a section having a small pitch (between unit pixels sharing the FD region 4) and a section having a large pitch (between unit pixels not sharing the FD region 4) appear alternately. That is, the arrangement is deviated from the arrangement of equal intervals having the translational symmetry in the usual CMOS image sensor described with reference to FIG. 7A.

On the other hand, as shown in FIG. 8, an insulating film 24 made of silicon oxide and the like is formed on the silicon substrate 1, and not-shown multilayer wiring is formed therethrough. The multilayer wiring is laid out, while avoiding areas over the photodiodes 2 so as to introduce light as much as possible into the photodiodes 2. Also, a not-shown shielding film is arranged so that light does not enter a circuit area including MOS transistors.

Further over the film, a passivation film 25 made of silicon nitride and the like, a planarizing film and the like are formed, interlayer lenses 131 and a shielding film 37 are formed thereon, and pixel color filters 26 and on-chip lenses 27 are formed further thereon.

The on-chip lenses 27 which are the lenses closest to a subject are provided so that optical axis positions thereof coincide with the central positions of unit pixels. The shielding film 37 which shields areas other than the photoelectric conversion regions 2 on the silicon substrate 1 from incident light is provided so that the centers of openings thereof coincide with the central positions of unit pixels. According to the configuration, positions in which incident light is collected at respective pixels are disposed at a fixed pitch, which improves image quality. In addition, the optical axis positions of the intra lenses 131 are also provided so as to coincide with the central positions of unit pixels. As a result, light entering the on-chip lenses 27 in parallel with the optical axes passes through the on-chip lenses 27, then, collected so as to be focused at rather deep positions in the central positions of respective unit pixels as shown by dotted lines in FIG. 8. The light is further collected by the intra lens 131 so as to be focused at shallower positions in the central positions of respective unit pixels.

As described above, the photodiode 2 is provided, being deviated to the side of the FD region 4 (the side of the boundary position 31), and multilayer wiring is formed, being deviated from the central position of the unit pixel so as to avoid the area over the photodiode 2.

According to the above, there arise a problem that some of light collected by the on-chip lenses 27 and the intra lenses 131 enters a (not shown) shielding film over the common regions in the silicon substrate 1 on which transistors are formed, deviated from the photodiodes 2, or some of light is shaded by the multilayer wiring. At this time, since the arrangement of transistors and the arrangement of wiring in the common regions are not same between adjacent unit pixels, the problem will be a cause of decreasing the amount of incident light entering the photodiode 2 as well as will be a cause of varying the amount of incident light between respective unit pixels. When the amount of incident light entering the photodiode 2 varies between respective unit pixels, sensitivity is not fixed at respective unit pixels, which is not preferable as an imaging characteristic.

FIG. 9 is a cross-sectional view showing a configuration of an imaging area of a CMOS image sensor in which a shielding film 37 is formed so as to correspond to the arrangement of the photodiodes 2 and the areas of the openings of the shielding film 37 are made to be small, so that light deviated from the photodiodes 2 or shaded by multilayer wiring is previously removed as measures for the above problem.

In the above method, it is seldom that some of incident light enters the shielding film over the common regions on the silicon substrate 1 or shaded by multilayer wiring, therefore, variations of the amount of incident light become small between respective unit pixels and variations of sensitivity between unit pixels decrease, as a result, a preferable imaging characteristic may be obtained. However, it is realized by abandoning some of incident light, and there is an unacceptable problem that the sensitivity of the CMOS image sensor decreases.

In addition, light reflected at the shielding film 37 repeatedly reflected and enters the photodiode in another unit pixel, which causes color mixture. Since the shielding film 37 is formed so as to correspond to the arrangement of photodiodes 2, positions of openings from which incident light is collected from a subject in respective unit pixels are not arranged at a fixed pitch, which lowers image quality relating to position information of the subject.

As described above, in the pixel sharing technology sharing the amplifying transistor (AMP), the vertical selecting transistor (SEL) and the reset transistor (RST) between adjacent unit pixels of the CMOS image sensor, the number of transistors at each unit pixel can be decreased to sufficiently secure the light-receiving area of photodiodes. However, in this method, the photoelectric conversion region is provided at a position which is deviated from the central position in the unit pixel, therefore, when light is collected by the on-chip lens whose optical axis is arranged at the central position of the unit pixel, it is difficult to collect incident light efficiently at the photoelectric region, as a result, the amount of light collected at each photoelectric conversion region is reduced or the amount of light widely varies at respective unit pixels.

In view of the above, it is desirable to provide a solid-state imaging device and an imaging apparatus using the solid-state imaging device, which are capable of collecting incident light efficiently at photoelectric conversion regions even when the photoelectric conversion regions are arranged at positions displaced from positions of the translational symmetry arrangement.

An embodiment of the invention relates to a solid-state imaging device in which plural unit areas, each having a photoelectric conversion region converting incident light into electric signals are provided adjacently, in which each photoelectric conversion region is provided being deviated from the central position of each unit area to a boundary position between the plural unit areas, a high refractive index material layer is arranged over the deviated photoelectric conversion region, and a low refractive index material layer is provided over the photoelectric conversion region at the inverse side of the deviated direction being adjacent to the high refractive index material layer, and optical paths of the incident light are changed by the high refractive index material layer and the low refractive index material layer, and incident light enters the photoelectric conversion region.

Another embodiment of the invention relates to an imaging apparatus including the solid-state imaging device, a signal processing unit which performs processing of output signals of the solid-state imaging device and a recording unit which records output signals of the signal processing unit.

According to the solid-state imaging device of the embodiments of the invention, a high refractive index material layer is arranged on the deviated photoelectric conversion region and a low refractive index material layer is arranged on the photoelectric conversion region at the inverse side of the deviated direction being adjacent to the high refractive index material layer.

According to the above, light obliquely entering the high refractive index material layer at a position close to the photoelectric conversion region is refracted so that a refracting angle becomes smaller than an incident angle at the surface of the high refractive index material layer, therefore, an optical path is changed in the direction coming close to the boundary position between unit areas, and some of light which will be deviated from the photoelectric conversion region when going straight enters the photoelectric conversion region, as a result, much light enters the photoelectric conversion region.

Also, light obliquely entering the low refractive index material layer at a position distant from the photoelectric conversion region is refracted so that a refracting angle becomes larger than an incident angle at the surface of the low refractive index material layer, therefore, an optical path is changed in the direction coming close to the boundary position between unit areas, and some of light which will be deviated from the photoelectric conversion region when going straight enters into the photoelectric conversion region, as a result, much light enters the photoelectric conversion region.

As described above, the high refractive index material layer is arranged at the position close to the photoelectric conversion region and the low refractive index material layer is arranged at the position distant from the photoelectric conversion region, whereby the paths of light can be changed so as to increase light entering the photoelectric conversion region.

As described above, according to the solid-state imaging device of the embodiments of the invention, even when the photoelectric conversion region is provided being deviated from the central position of each unit area to the boundary position side between plural unit area, the decrease of the amount of light into the photoelectric conversion region due to the deviation can be suppressed. In addition, the FD region common to the adjacent photoelectric conversion regions can be arranged at the boundary position between unit areas, therefore, the device is allowed to be miniaturized and to be high in density.

Also, since the imaging apparatus of the embodiments of the invention includes the solid-state imaging device, a signal processing unit which performs processing of output signals of the solid-state imaging device, and a recording unit which records output signals of the signal processing unit, imaging signals obtained by the solid-state imaging device can be recoded after performing signal processing.

DESCRIPTION OF THE PREFERRED EMBODIMENTS

Figure 1:
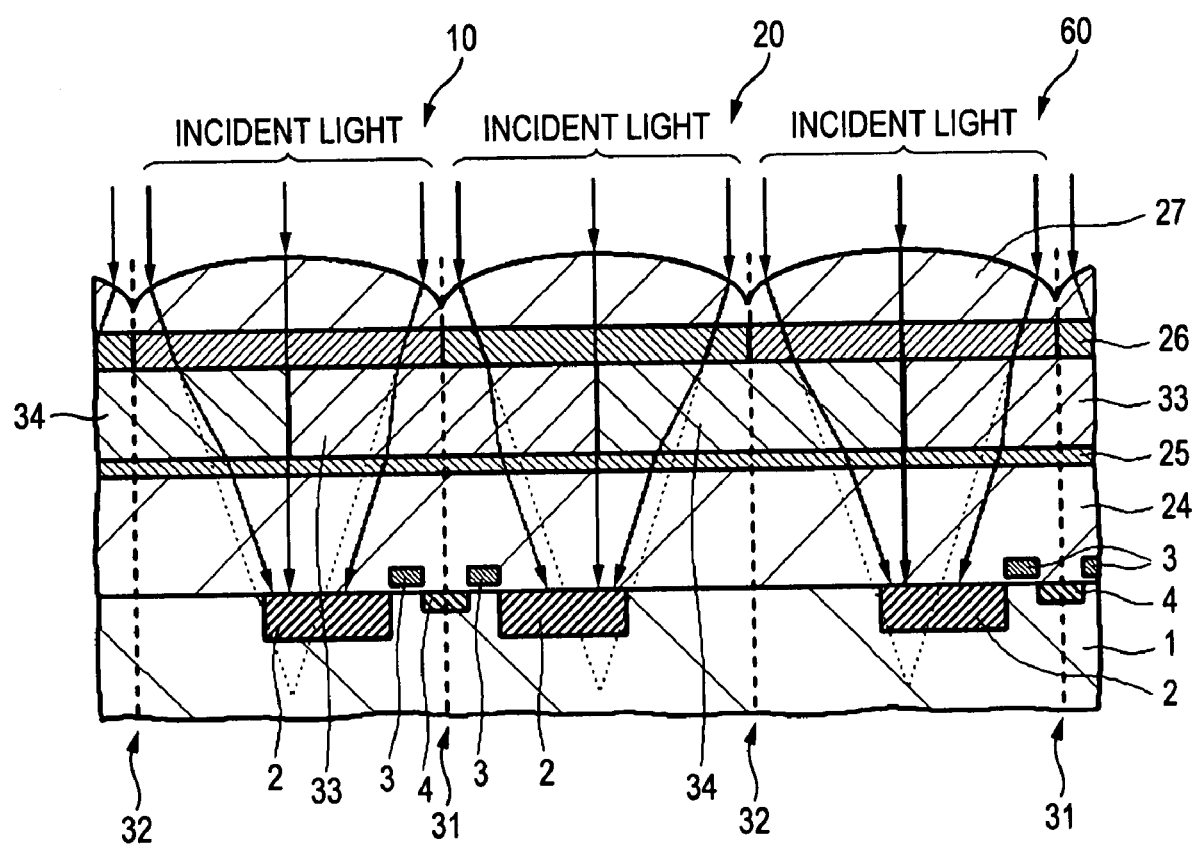
FIG. 1 is a cross-sectional view of a relevant part showing a configuration of an imaging unit of a CMOS image sensor based on Embodiment 1 of the invention.

In a solid-state imaging device of some embodiments of the invention, it is preferable that an output extraction region which is common to the plural photoelectric conversion regions is formed at the boundary position. At this time, it is preferable that charge transfer gates are formed between each of plural photoelectric conversion regions and the common output extraction region. According to this, an outputting circuit after the common output extraction region can be shared between the plural photoelectric conversion regions, thereby reducing the area necessary for output on the substrate, which enables the solid-state imaging device to be miniaturized or to increase the number of pixels, and to prevent the reduction of the light receiving area in the unit pixel caused by miniaturization or increase of the number of pixels in the solid-state imaging device. The output of plural photoelectric conversion regions can be extracted by selecting using the charge transfer gate.

It is preferable that the plural unit areas have the same degree of deviation with one another. At this time, it is preferable that respective central positions of the high refractive index material layer and the low refractive index material layer exist on the boundary positions. This means that they are symmetrical with respect to the boundary position. It is natural because the unit areas having the same configuration are disposed at both sides of the boundary positions, however, there are merits such that a forming process becomes simple when they have the symmetry of some kind.

In addition, materials for the high refractive index material layer and the low refractive index material layer are not particularly limited, however, it is preferable that the high refractive index material layer is made of materials having refractive index as large as possible, for example, silicon nitride material (refractive index: approximately 2.0) or titanium oxide dispersed polyimide (refractive index: approximately 1.8), and the low refractive index material layer is made of materials having refractive index as small as possible, for example, fluorinated polymer (refractive index: approximately 1.3 to 1.4) or silicon oxide material (refractive index: approximately 1.4 to 1.5). According to this, effects of the high refractive material layer and the low refractive material layer are brought out more effectively.

It is preferable that the high refractive index material layer and the low refractive material layer are provided between an insulating layer in which wiring for transmitting output signals of the photoelectric conversion regions is embedded and an on-chip lens region. At this time, it is also preferable that the high refractive index material layer and the low refractive index material layer are provided between a passivation film on the insulating layer and a filter layer below the on-chip lens region. According to the arrangement, effects of the high refractive material layer and the low refractive material layer are brought out most effectively.

It is also preferable that the high refractive index material layer has a lens-shape, and the low refractive index material layer extends to an upper part or a lower part of the high refractive index material layer. According to this, the high refractive index layer is arranged on the deviated photoelectric conversion region, and the low refractive index material is arranged on the photoelectric conversion region in the inverse side of the deviated direction being adjacent to the high refractive index material layer, and the high refractive index material layer has the lens-shape and the low refractive index material layer extends to the upper part or the lower part of the high refractive index material layer, therefore, in addition to the effect of above-described high refractive index material layer and the lower index material layer, incident light can be deviated and collected towards the existing photoelectric conversion regions according to the lens effect. At this time, in the case that the low refractive index material layer extends to the upper part of the high refractive index material layer, these two layers forms a convex lens which is convex with respect to the upper part, and in the case that the low refractive index material layer extends to the lower part of the high refractive index material layer, these two layers forms a convex lens which is convex with respect to the lower part.

In this case, it is preferable that the high refractive index material layer having the lens shape is a first lens region, a second lens region provided over the first lens region is included, and optical axes of the second lens region are arranged at equal intervals so as to coincide with the central positions of the unit areas. Since the second lens region includes lenses closest to a subject, it is preferable that optical axis positions thereof are provided at equal intervals so as to coincide with the central positions of the unit areas. It is preferable that a shielding region which shields areas other than the photoelectric conversion regions on a semiconductor base on which the photoelectric conversion regions are formed from the incident light is provided over the photoelectric conversion regions so that the centers of openings coincide with the central positions of the unit areas. According to this, positions in which incident light from the subject in respective pixels are arranged at a fixed pitch regardless of the positions in which the photoelectric conversion regions are provided, thereby improving image quality.

Further in this case, it is preferable that an output extraction region which is common to the plural photoelectric conversion regions is formed at the boundary position. At this time, it is preferable that charge transfer gates are formed between each of the plural photoelectric conversion regions and the common output extraction region. According to this, an outputting circuit after the common output extraction region can be shared between the plural photoelectric conversion regions, thereby reducing the area necessary for output on the substrate, which enables the solid-state imaging device to be miniaturized or to increase the number of pixels, and to prevent the reduction of the light receiving area in the unit pixel caused by miniaturization or increase of the number of pixels in the solid-state imaging device. The output of plural photoelectric conversion regions can be extracted by selecting using the charge transfer gate.

Next, preferable embodiments of the invention will be explained specifically and in details with reference to the drawings.

Embodiment 1

In Embodiment 1, as an example of the solid-state imaging device of the invention, a CMOS image sensor will be explained. In the CMOS image sensor, an FD (floating diffusion) region common to two or four unit areas (hereinafter, referred to as unit pixels) is provided as an output extraction region which is common to the plural photoelectric conversion regions, and an amplifying transistor, a vertical selecting transistor and a reset transistor are shared between these unit pixels, thereby reducing the number of transistors at each unit pixel to sufficiently secure the light receiving area of the photodiode.

As a result of the above, it is inevitable that the photoelectric conversion region is provided being deviated from the central position of each unit pixel. In order to respond to this, in Embodiment 1, a high refractive index material layer is arranged over the deviated photoelectric conversion regions as well as a low refractive index material layer is arranged over the photoelectric conversion regions of the inverse side of the deviated direction, thereby changing optical paths of the incident light, so that the incident light enters the deviated photoelectric conversion regions.

Figure 2:
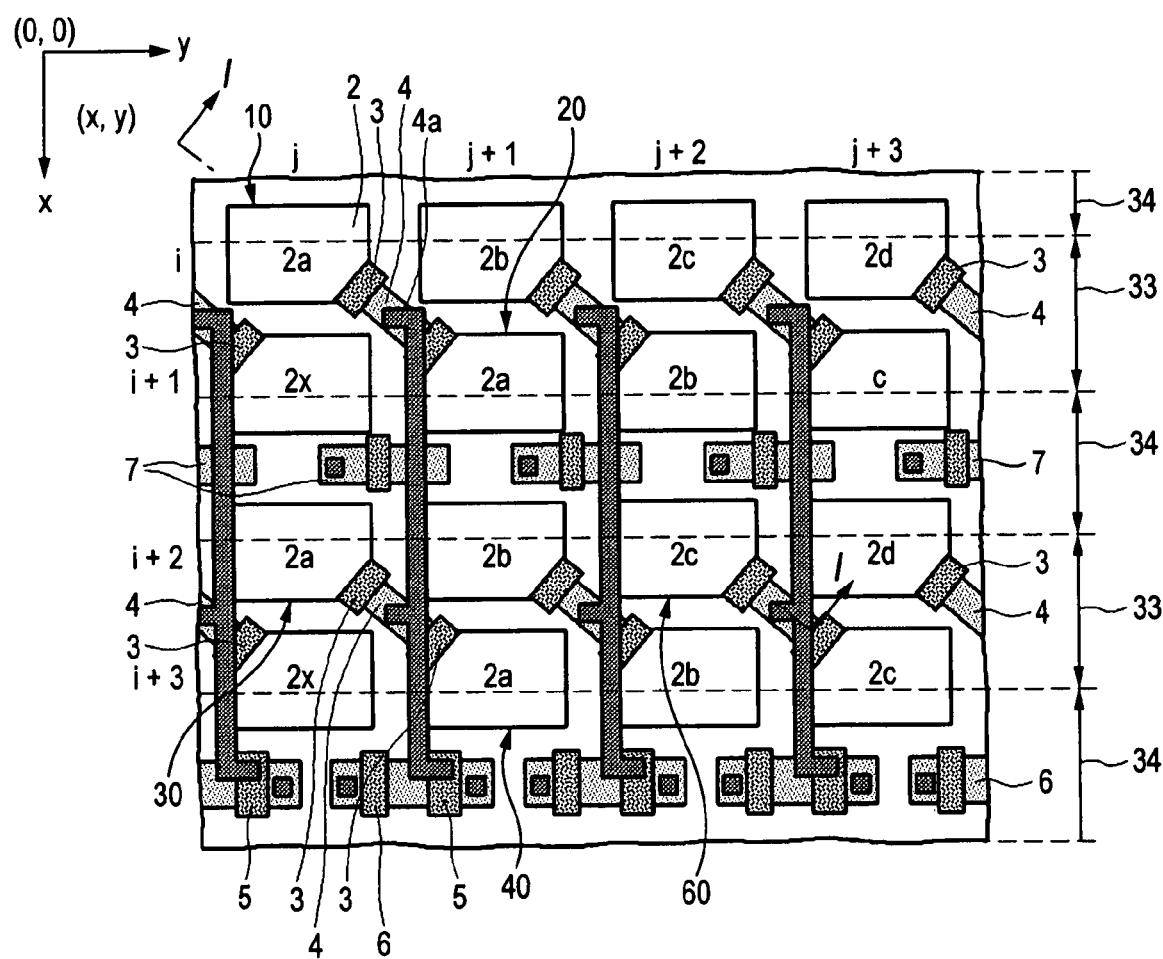
FIG. 2 is a plan view of a relevant part showing the configuration of the imaging unit of the CMOS image sensor based on Embodiment 1 of the invention.

FIG. 1 and FIG. 2 are a cross-sectional view (FIG. 1) and a plan view (FIG. 2) showing a configuration of an imaging unit of a CMOS image sensor based on Embodiment 1. FIG. 1 is a cross-sectional view at a position shown by a 1F-1F line in FIG. 2. In FIG. 2, the photoelectric conversion regions 2 of four unit pixels sharing transistors 5 to 7 are shown by putting the same codes (2a, 2b, 2c, 2d, . . . 2x). In order to show positions of unit pixels, the original point (0, 0) is taken at the upper-left, and a pair (x, y) of "x" (row number) representing a position in the vertical direction and "y" (column number) representing a position in the horizontal direction is used.

FIG. 1 shows mainly three unit pixels, a unit pixel 10 at the left side and a unit pixel 20 in the middle share an FD region 4 mutually at a boundary position 31, however, a unit pixel 60 at the right and the unit pixel 20 in the middle do not share the FD region 4. In respective unit pixels 10, 20 and 60, photoelectric conversion regions 2 (in FIG. 2, 2a, 2a, 2c, respectively) formed by embedded photodiodes are formed in the silicon substrate 1.

Figure 7A:
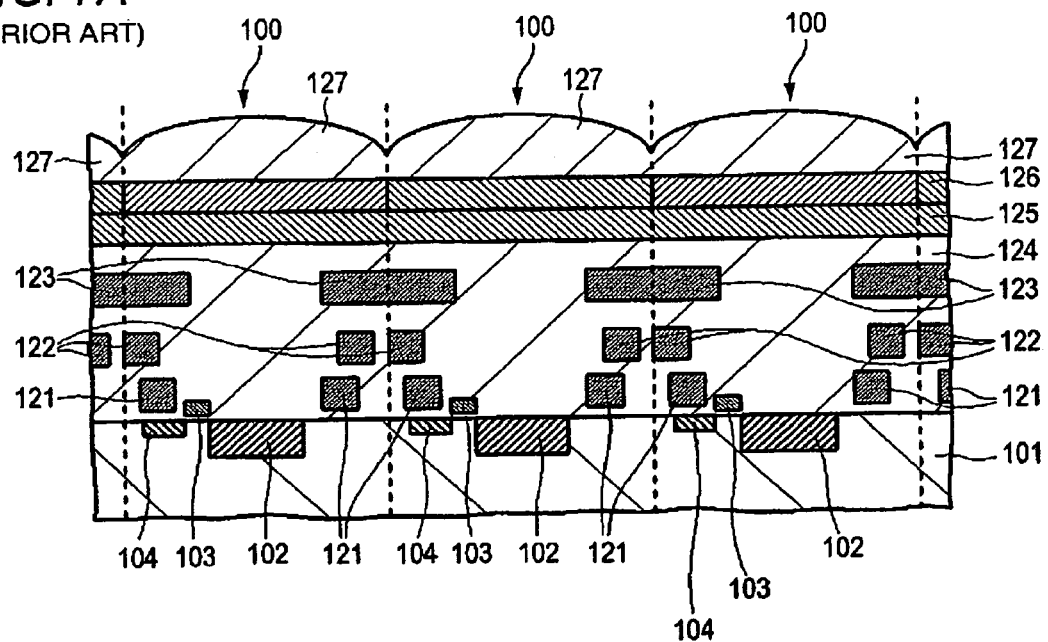
FIG. 7A is a cross-sectional view showing a configuration of the CMOS image sensor of the above and FIG. 7B is an explanatory diagram schematically showing the correspondence between peripheral impurity layers of an FD region, which is difficult to be shown only by the cross-sectional view of FIG. 7A.
Figure 7B:
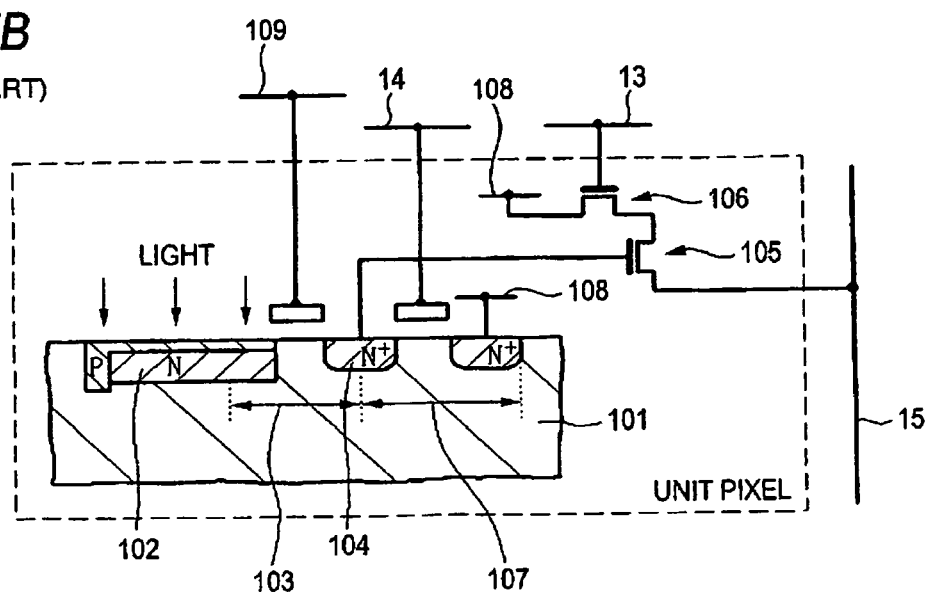

As has been described with reference to FIG. 7B, an n-type region of the photodiode 2 and an n-type region of the FD region 4 are provided being connected through a channel region of a charge transfer gate 3 so as to be able to transfer signal charges efficiently. Therefore, as has been described with reference to FIG. 8, the photoelectric conversion region 2 is provided being deviated to the side of the FD region 4 (the side of the boundary position 31) from the central position of the unit pixel. As shown in FIG. 2, at an area of the opposite side of the FD region 4 (in FIG. 1, the boundary position 32 and in the vicinity thereof), the amplifying transistor 5, the vertical selecting transistor 6 and reset transistor 7 which are shared between pixels are formed. As a result, the arrangement formed by respective photoelectric conversion regions 2 is the arrangement in which a section having a small pitch (between unit pixels sharing the FD region 4 mutually) and a section having a large pitch (between unit pixels not sharing the FD region 4) appear alternately in the oblique direction in FIG. 2. This is deviated from the arrangement of equal intervals having the translational symmetry in the CMOS image sensor of related arts described with reference to FIG. 7A.

On the other hand, as shown in FIG. 1, over the silicon substrate 1, an insulating layer 24 made of silicon oxide and the like is formed, and not-shown multilayer wiring made of, for example, aluminum and the like is formed therethrough. In the multilayer wiring, as has been described with reference to FIG. 7A, for example, wiring as a first layer is local wiring such as between pixel transistors, wiring as a second layer and wiring as a third layer are global wiring such as a vertical selection line 13, a vertical signal line 15 and the like. It is necessary to increase the opening ratio of the photodiodes 2 in order to introduce light as much as possible into the photodiodes 2, therefore, the multilayer wiring is laid out so as to avoid areas over the photodiodes 2 as far as possible. In addition, a not-shown shielding film is arranged so that light does not enter circuit units including MOS transistors.

Further over the layer, a passivation film 25 made of silicon nitride and the like, a planarizing film and the like are formed, and a high refractive index material layer 33 and a low refractive index material layer 34 which are a characteristic of the embodiment of the invention are formed thereover, further, pixel color filters 26 and on-chip lenses 27 are formed thereon.

As shown in FIG. 1 and FIG. 2, the photoelectric conversion region 2a of the unit pixel (i, j) 10 and the photoelectric conversion region 2a of the unit pixel (i+1, j+1) 20 are arranged centrosymmetric with the FD region 4 as the center. Similarly, each photoelectric conversion regions 2b, 2c, 2d, . . . in the i-th row of FIG. 2 are arranged centrosymmetric with the FD regions 4 as the center with respect to photoelectric conversion regions 2b, 2c, 2d, . . . in columns of immediate right in the (i+1)th row. It is preferable that the high refractive index material layer 33 and the low refractive index material layer 34 are formed in a belt shape in which the longitudinal direction corresponds to the lateral direction of FIG. 2, and both layers are provided so as to be aligned in the width direction alternately, so as to correspond to the above configuration, as shown by dotted lines in FIG. 2. At this time, it is preferable that the central line of the high refraction index material layer 33 is just over the FD region 4, and the width of the belt-shaped high refractive index material layer 33 and the width of the belt-shaped low refractive index material layer 34 are equal. The width of the high refractive index material layer 33 and the low refractive index material layer 34 is not limited to this, however it is preferable that the layers have the appropriately the same width in consideration of the balance of effect between the both. It is also preferable that a material layer having the intermediate refractive index is provided in addition to the high refractive index material layer 33 and the low refractive index material layer 34.

Materials for the high refractive index material layer 33 and the low refractive index material layer 34 are not particularly limited, however, it is preferable that the high refractive index material layer 33 is made of materials having refractive index as large as possible, for example, silicon nitride material (refractive index: approximately 2.0) or titanium oxide dispersed polyimide (refractive index: approximately 1.8), and the low refractive index material layer 34 is made of materials having refractive index as small as possible, for example, fluorinated polymer (refractive index: approximately 1.3 to 1.4) or silicon oxide material (refractive index: approximately 1.4 to 1.5). According to this, the high refractive material layer 33 and the low refractive material layer 34 can be further effective.

Respective pixel lenses forming the on-chip lenses 27 shown in FIG. 1 are arranged at equal intervals so as to have the translational symmetry as same as the arrangement of unit pixels. Therefore, in cases of related arts in which there is no high refractive index material layer 33 and no low refractive index material layer 34, incident light passes through respective pixel lenses, then, collected to be focused at the central positions of respective unit pixels as shown in FIG. 1 by dotted lines. Since the photoelectric conversion regions 2 are provided being deviated to the side of the boundary position 31 from the central positions of respective unit pixels, it is difficult to collect light into the photoelectric conversion regions 2 effectively in this state.

Whereas in the embodiment, the high refractive index material layer 33 and the low refractive index material layer 34 are provided. Therefore, light obliquely entering from the on-chip lenses 27 into the high refractive index material layer 33 which is close to the photoelectric conversion regions 2 is refracted at the surface of the high refractive index material layer 33 so that a refracting angle becomes smaller than the incident angle, therefore, optical paths are changed to the direction coming close to the boundary position 31 between pixel units, and some light which will be deviated from the photoelectric conversion regions 2 when going straight enters the photoelectric conversion regions 2, as a result, much light enters the photoelectric conversion regions 2.

Also, light obliquely entering from the on-chip lenses 27 into the low refractive index material layer 34 which is distant from the photoelectric conversion regions 2 is refracted at the surface of the low refractive index material layer 34 so that a refracting angle becomes larger than the incident angle, therefore, optical paths are changed to the direction close to the boundary position 31 between pixel units, and some light which will be deviated from the photoelectric conversion regions 2 when going straight enters the photoelectric conversion regions 2, as a result, much light enters the photoelectric conversion regions 2.

According to the above, paths of light going as shown by dotted lines in FIG. 1 when there is no high refractive index material layer 33 and no low refractive index material layer 34 are changed as shown by solid lines in FIG. 1 when there are the high refractive index material layer 33 and the low refractive index material layer 34, as a result, incident light is collected efficiently into the photoelectric conversion regions 2 provided being deviated from the central positions of the unit pixels.

FIG. 1 has been made by simplifying the refractive indexes of the high refractive index material layer 33 and the low refractive index material layer 34 are 1.8 and 1.4 respectively and the refractive index of the pixel color filters 26 and the insulating layer 24 provided in the vicinity is 1.6 in order to avoid complication and to clarify the nature.

As shown in the plan view of FIG. 2, in the imaging unit of the CMOS image sensor based on the embodiment, four unit pixels, for example, the unit pixel (i, j) 10, the unit pixel (i+1, j+1) 20, the unit pixel (i+2, j) 30, and the unit pixel (i+3, j+1) 40 share the amplifying transistor 5, the vertical selecting transistor 6, the reset transistor 7 and the like. At this time, the unit pixels 10 and 20, and the unit pixels 30 and 40 share the FD regions 4, respectively, and two FD regions 4 are connected by FD region wiring 4a, connected to a gate electrode of the amplifying gate 5. In FIG. 2, the FD region wiring 4a is drawn as being superimposed on the FD regions 4 and transistors 5 to 7, however, it is actually formed through an interlayer insulating film and connected to transistors and the like by connecting plugs.

Figure 3:
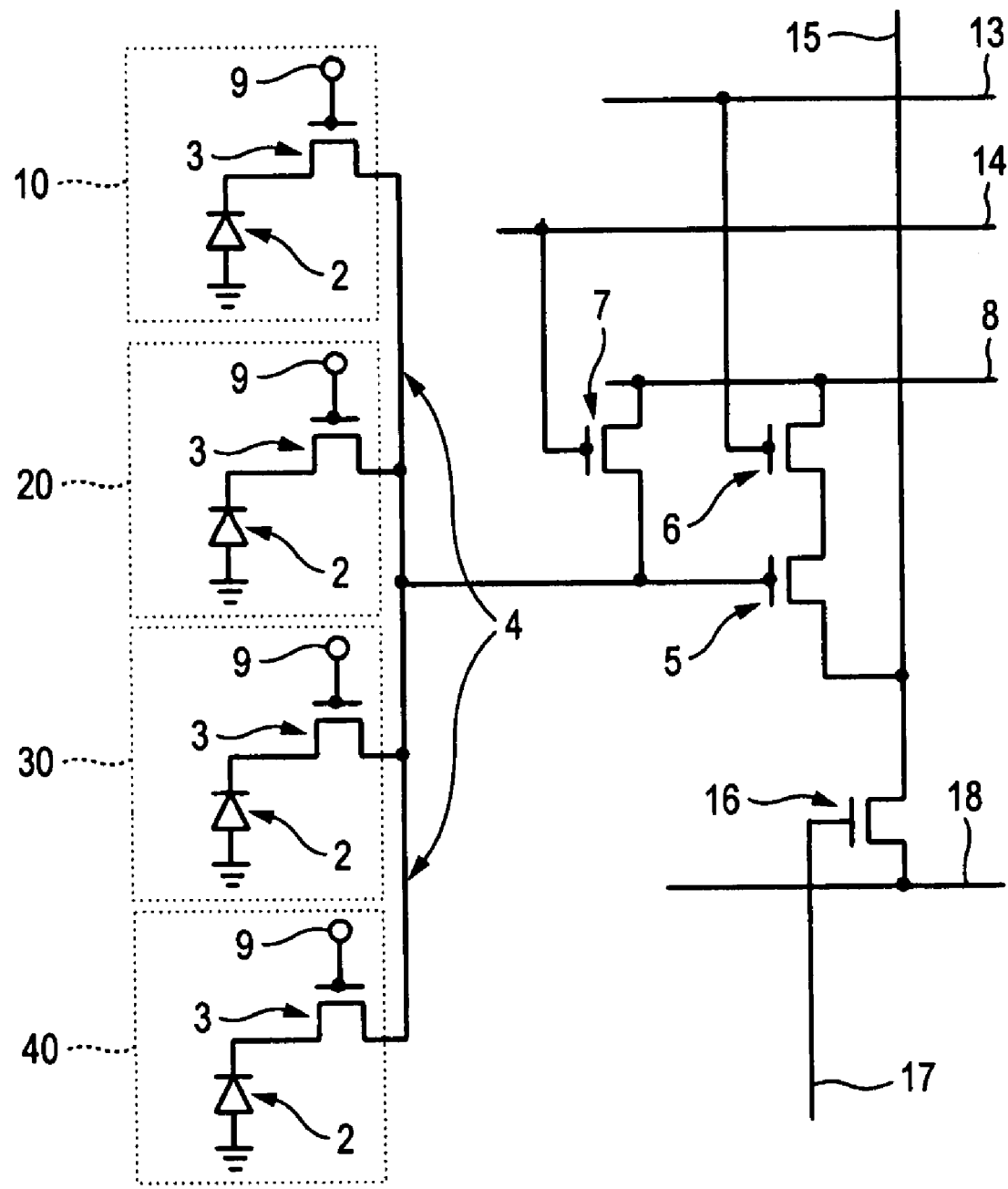
FIG. 3 is an explanatory diagram showing equivalent circuits of four unit pixels sharing transistors in the imaging unit of the CMOS image sensor based on Embodiment 1 of the invention.
Figure 6:
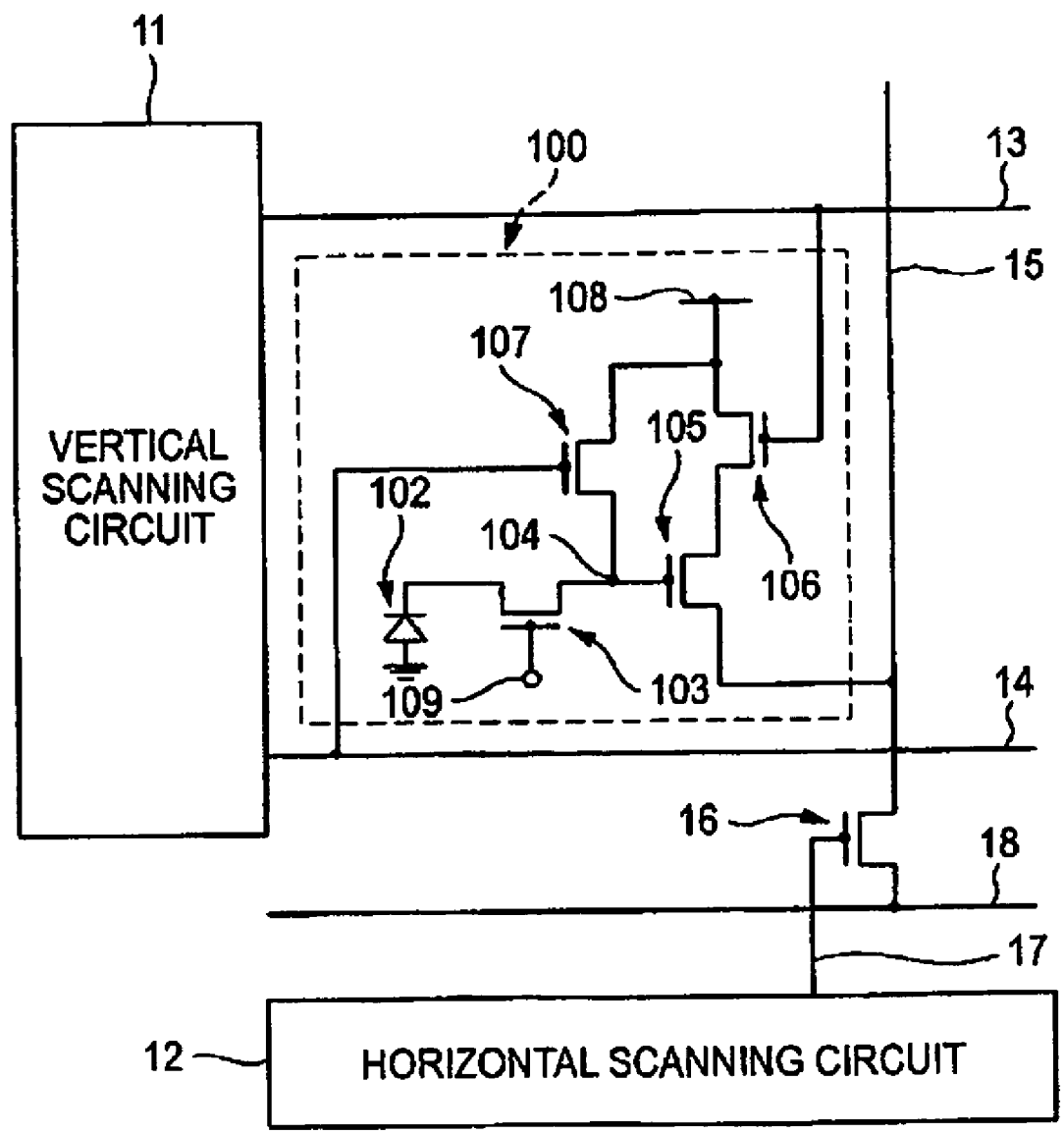
FIG. 6 is an explanatory view showing a configuration of an imaging unit of a CMOS image sensor of a related art and an example of an equivalent circuit of one unit pixel.

FIG. 3 is an explanatory diagram showing equivalent circuits of four unit pixels sharing transistors in the imaging unit of the CMOS image sensor based on the embodiment. The configuration of the CMOS image sensor is substantially the same as the configuration of the imaging unit of the CMOS image sensor of the related art, which has been described with reference to FIG. 6, however, it is different in a point that the FD region 4 common to the four unit pixels 10 to 40 is provided and the amplifying transistor 5, the vertical selecting transistor 6 and the reset transistor 7 are shared between these unit pixels. The photoelectric conversion regions 2a in respective unit pixels are connected to the FD region 4 through the charge transfer gates 3 as described with reference to FIG. 1.

At the time of light-receiving operation, respective unit pixels are scanned once during a cycle by the vertical scanning circuit and the horizontal scanning circuit as described below. Specifically, a vertical selection pulse is outputted to one vertical selection line 13 from the vertical selecting circuit for a prescribed period during a cycle, and unit pixels 10 to 40 which form one group by four pixels corresponding to the vertical selection line 13 are selected. At this time, signal charges (electrons) accumulated in the photoelectric conversion regions 2 of respective unit pixels 10 to 40 are sequentially transferred to the floating diffusion (FD) unit 4 through the charge transfer gates 3 based on a readout pulse applied to gate electrodes of the charge transfer gates 3 from readout signal lines 9, and potential change of the FD region 4 by the signal charges (electrons) is converted into a voltage signal by the amplifying transistor 5 to be outputted to the vertical signal line 15.

During the prescribed period, a horizontal selection pulse is sequentially outputted to each horizontal selection line 17 from the horizontal scanning circuit, and an output signal of corresponding each vertical signal line 15 is sequentially extracted to the horizontal signal line 18 through the horizontal selecting transistor 16. When scanning of all pixels in one row is finished, the vertical selection pulse is outputted to the vertical selection line 13 of next row, and respective pixels in the new row are scanned in the same way as the above. By repeating the above operation, all pixels in all rows are scanned once during a cycle, and output signals thereof will be extracted to the horizontal signal lines 18 in time series.

The vertical selecting transistor 6 turns on and off based on the vertical selection pulse applied to the gate electrode from the vertical selection line 13, performs a function of driving the amplifying transistor 5 for a prescribed period, and the reset transistor 7 performs a function of resetting the potential of the FD region 4 to the potential of the power source line 8 based on a vertical reset pulse applied to the gate electrode from the vertical reset line 14 in the same manner as related arts.

As described above, in the CMOS image sensor which is the solid-state imaging device based on the embodiment, the FD region 4 common to the four unit pixels is provided at the boundary position between pixels as a common output extraction region, and the amplifying transistor 5, the vertical selecting transistor 6 and the reset transistor 7 are shared between these unit pixels, therefore, the number of transistors at each unit pixel can be decreased. As a result, the area necessary for output on the substrate can be reduced, which enables the CMOS image sensor to be miniaturized or to increase the number of pixels, and to prevent the reduction of the light receiving area in the unit pixel caused by miniaturization or increase of the number of pixels in the CMOS image sensor.

In this case, even when the photoelectric conversion regions 2 are arranged being deviated from positions of translational symmetry which is prescribed in arrangement of unit pixels, the high refractive index material layer 33 and the low refractive index material layer 34 are provided between the photoelectric conversion regions 2 and the on-chip lenses 27, thereby collecting incident light into the photoelectric conversion regions effectively by using the on-chip lenses in which respective pixel lenses of related arts are arranged with the translational symmetry. As a result, deterioration of sensitivity and variations of sensitivity between pixels can be suppressed.

Embodiment 2

In Embodiment 2, as an example of the solid-state imaging device of the invention, a CMOS image sensor will be explained.

In the CMOS image sensor, as same as Embodiment 1, the FD region which is common to two or four unit areas (hereinafter, referred to as unit pixels) is provided as the output extraction region common to the plural photoelectric conversion regions, and the amplifying transistor, the vertical selecting transistor and the reset transistor are shared between the unit pixels, thereby decreasing the number of transistors at each unit pixel to sufficiently secure the light receiving area of photodiodes (refer to FIG. 2).

As a result, it is inevitable that the photoelectric conversion region is provided being deviated from the central position of each unit pixel. In order to respond to this, in Embodiment 2, one or plural lenses are provided along light paths of incident light over the deviated photoelectric conversion regions, and at least one of them is provided so that a position of the light path is deviated in the same direction as the deviated direction from the central position of the unit pixel, and the light paths of incident light are changed by the effect of the lens to make incident light to enter the deviated photoelectric conversion regions. The embodiment is the same as Embodiment 1 except this point, therefore, explanation will be performed with emphasis on the different point.

Figure 4:
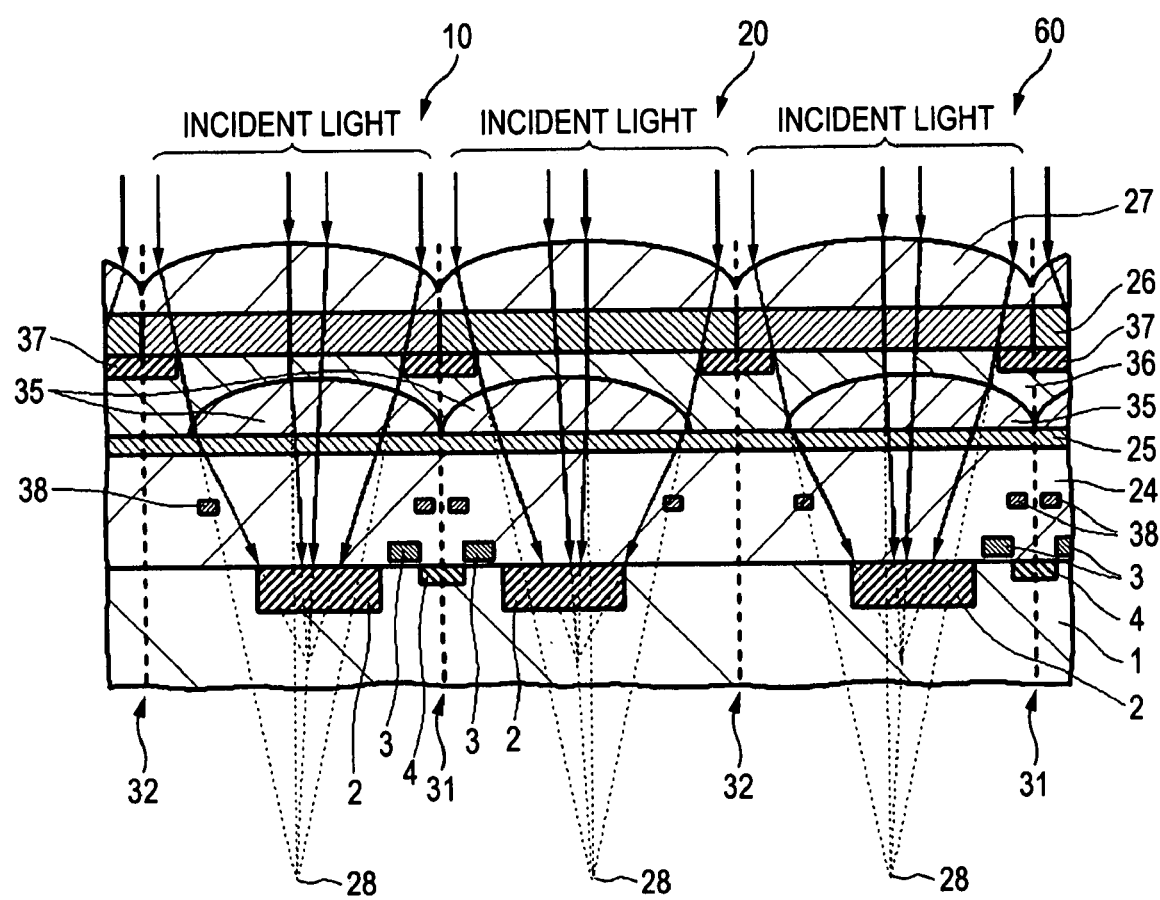
FIG. 4 is a cross-sectional view of a relevant part showing a configuration of an imaging unit of a CMOS image sensor based on Embodiment 2 of the invention.

FIG. 4 is a cross-sectional view showing a configuration of an imaging unit of the CMOS image sensor based on Embodiment 2. FIG. 4 is the cross-sectional view at a position shown by a 1F-1F line in FIG. 2 as same as FIG. 1. In FIG. 4, three unit pixels are chiefly shown, and a unit pixel 10 at the left and a unit pixel 20 in the middle share an FD region 4 at the boundary position 31 mutually, however, a unit pixel 60 at the right and the unit pixel 20 in the middle do not share the FD region 4.

As has been described in Embodiment 1, the photoelectric conversion region 2 is provided being deviated to the side of the FD region 4 (the side of a boundary position 31) from the central position of the unit pixel, therefore, the arrangement is deviated from the arrangement of equal intervals having translational symmetry in the CMOS image sensors of related arts. At an area of the opposite side of the FD region 4 (a boundary position 32 and in the vicinity thereof) in the unit pixel, an amplifying transistor 5, a vertical selecting transistor 6 and a reset transistor 7 and the like are formed.

On the other hand, an insulating layer 24 made of silicon oxide is formed on a silicon substrate 1, and not-shown multilayer wiring is formed therethrough. The multilayer wiring is laid out, avoiding areas over photodiodes 2 in order to introduce light as much as possible at the photodiodes 2. In addition, a not-shown shielding film is arranged so that light does not enter circuit units including MOS transistors.

Further over the layer, a passivation film 25 made of silicon nitride and the like, and a planarizing film and the like are formed, and intra lenses 35 and a shielding film 37 which are characteristics of the embodiment are formed thereon, and pixel color filters 26 and on-chip lenses 27 are formed further thereon. The intra lenses 35 correspond to the high refractive index material layer. The planarizing film formed being extended upward from the intra lenses 35 is the low refractive index material layer 36 made of materials having smaller refractive index than materials forming the intra lenses 35, which corresponds to the low refractive index material layer.

The on-chip lenses 27 which are the lenses closest to a subject are provided so that optical axis positions thereof coincide with the central positions of the unit pixels. The shielding film 37 which is the shielding region for shielding regions other than the photoelectric conversion regions in the semiconductor base from incident light is provided so that the centers of openings thereof coincide with the central positions of unit pixels. According to this, positions where incident light is collected from the subject at respective unit pixels are arranged at a fixed pitch regardless of positions in which the photoelectric conversion regions 2 are provided.

On the other hand, optical axis positions of the intra lenses 35 are provided being deviated in the same directions as the deviated direction of the photoelectric conversion regions 2 from the central positions of unit pixels, namely, deviated to the side of the FD region 4 (the side of the boundary position 31). That is, the intra lenses 35 are arranged so as to narrow the intervals between intra lenses 35 at areas where the intervals between the photoelectric conversion regions 2 are narrowed, and arranged so as to widen the intervals between the intra lenses 35 at areas where the intervals between the photoelectric conversion regions 2 are widened.

As has been described with reference to FIG. 8, light entering the on-chip lenses 27 in parallel with the optical axes passes through the on-chip lens 27, then, collected so as to obtain focuses 28 at rather deep positions at the central positions of respective unit pixels as shown in FIG. 4 by dotted lines. The light is further collected by the intra lenses 35 so as to be focused at shallower positions.

Figure 8:
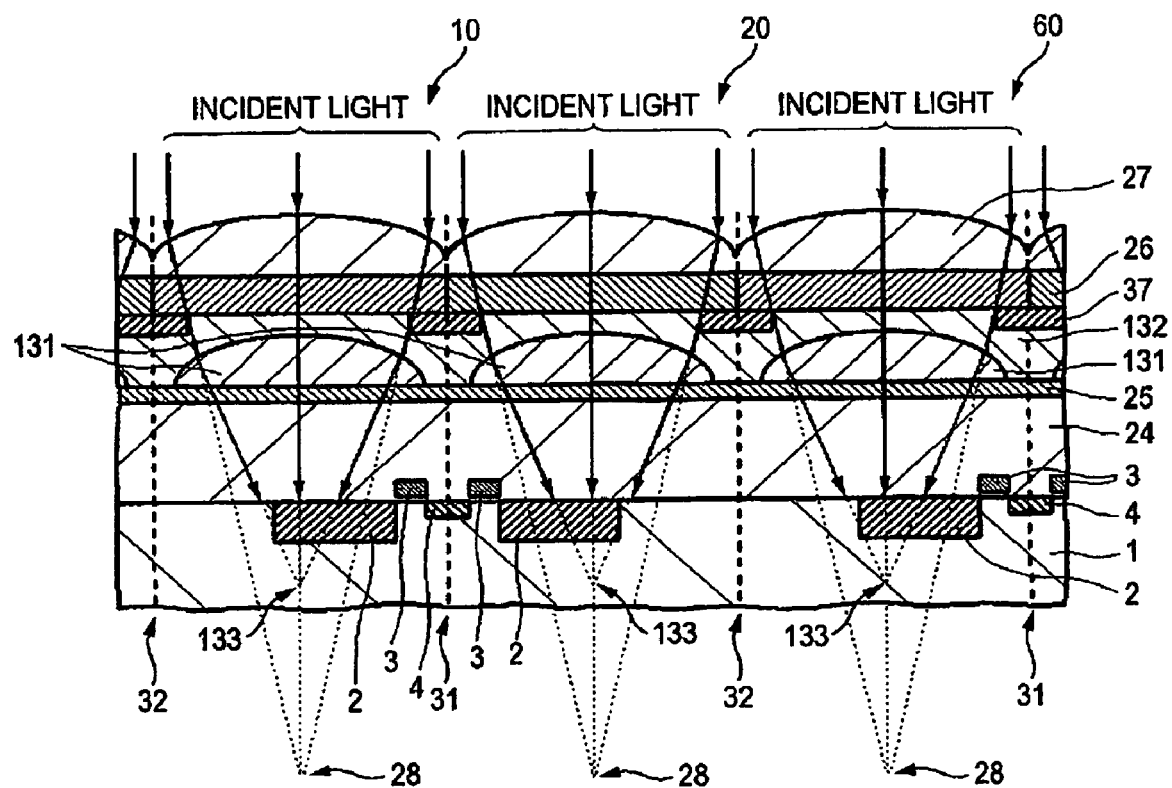
FIG. 8 is a cross-sectional view of an relevant part showing an example of a configuration of an imaging unit of a CMOS image sensor in which on-chip lenses and intra lenses similar to a related art are formed on a silicon substrate having common regions.
Figure 9:
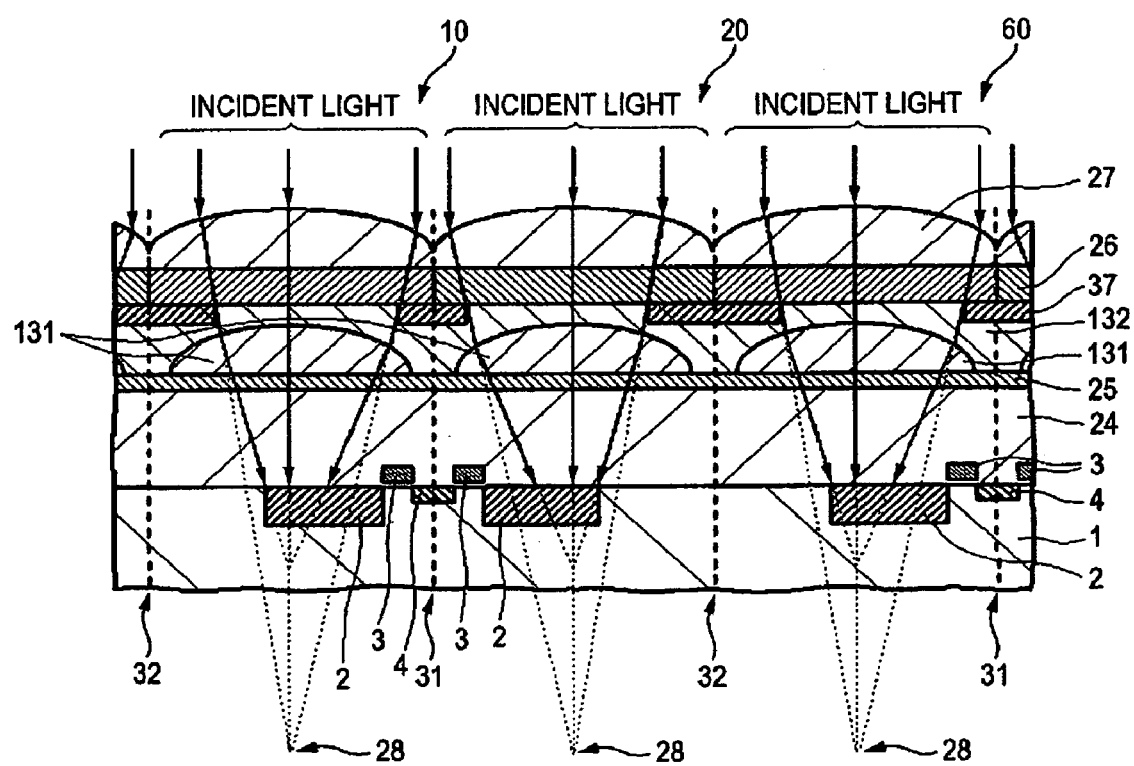
FIG. 9 is a cross-sectional view of an relevant part showing another example of the configuration of the imaging unit of the CMOS image sensor in which on-chip lenses and intra lenses similar to the related art are formed on the silicon substrate having common regions.

At this time, if the light axis positions of the intra lenses 35 are provided so as to be coincide with the central positions of the unit pixels, incident light is collected so as to be focused at the central positions of respective unit pixels as shown in FIG. 8, as a result, it is difficult to efficiently introduce incident light to the photoelectric conversion regions 2 provided being deviated from the central positions.

Actually, since the optical axis positions of the intra lenses 35 are provided being deviated to the side of the boundary position 31, optical paths of incident light are changed to the direction coming close to the boundary position 31 by the intra lenses 35 as shown in FIG. 4. As a result, as can be seen when comparing FIG. 4 with FIG. 8, light which will be deviated from the photoelectric conversion regions 2 when the optical axis positions of the intra lenses 35 are at the central positions of the unit pixels enters the photoelectric conversion regions 2, and incident light is efficiently introduced to photoelectric conversion regions 2.

In addition, it will seldom occur that some light collected by the on-chip lenses 27 and the intra lenses 35 enters the (not shown) shielding film over the common regions on the silicon substrate 1, or shaded by multilayer wiring, therefore, variations of the amount of incident light between respective unit pixels are reduced and the sensitivity between respective unit pixels becomes uniform, namely, preferable imaging characteristics can be obtained. Though there is a concern that color mixture occurs when shaded light leaks into adjacent pixels, shading of light is suppressed to the minimum, thereby reducing the color mixture.

At the upper area of the insulating layer 24, global wiring 38 such as control signal lines controlling operations of transistors and output signal lines outputting pixel signals from pixels is provided. Not only lenses but also these global wiring 38 is provided being deviated so as to correspond to positions of the photoelectric conversion regions 2, thereby reducing shading by wiring as compared with a case in which it is not deviated, therefore, the arrangement is efficient.

The example in which two lenses, namely, the on-chip lens 27 and the intra lens 35 are used is shown in the embodiment, however, it is not limited to this, and plural lenses is not always necessary at every pixel. In the case that plural lenses exist, the number of lenses is not limited to two, and three or more lenses are also preferable.

The embodiment is the same as Embodiment 1 except that the lens whose optical axis is deviated is used as the optical path changing means, therefore, it goes without saying that the same operation and effect as Embodiment 1 can be obtained with respect to common points. Specifically, as has been described with reference to FIG. 3, in the CMOS image sensor in the embodiment, the FD region 4 which is common to four unit pixels is provided at the boundary position between pixels as the common output extraction region, and the amplifying transistor 5, the vertical selecting transistor 6 and the reset transistor 7 are shared between these unit pixels, accordingly, the number of transistor at each unit pixel can be reduced. As a result, the area necessary for the output on the substrate can be reduced, therefore, the CMOS image sensor is allowed to be miniaturized or to be increased in the number of pixels, and the reduction of the light receiving area in the unit pixels caused by the miniaturization or the increase in the number of pixels can be prevented.

In this case, even when the photoelectric conversion regions 2 are provided being deviated from the position of translational symmetry prescribed in arrangement of unit pixels, the intra lenses 35 are provided so that optical axes are deviated in the same direction as the deviated direction of the photoelectric conversion regions 2, thereby efficiently collecting incident light into the photoelectric conversion regions 2 by using the on-chip lenses similar to the related arts. As a result, deterioration of sensitivity or variations of sensitivity between pixels can be suppressed.

Embodiment 3

Figure 5:
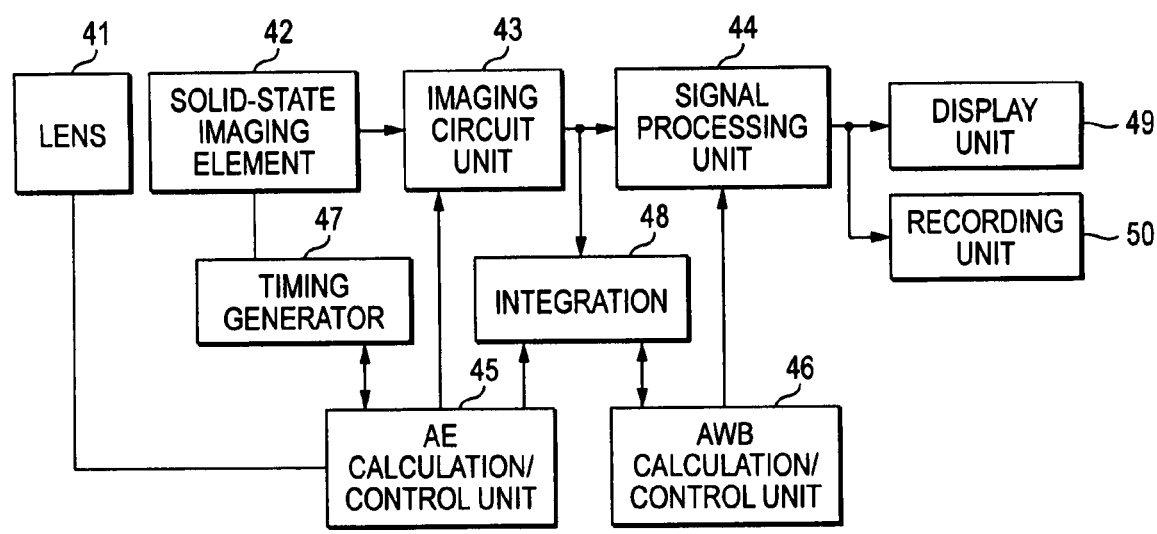
FIG. 5 is a block diagram showing a configuration of an imaging apparatus based on Embodiment 3 of the invention.

FIG. 5 is a block diagram showing a configuration of an imaging apparatus based on Embodiment 3 of the invention. The imaging apparatus includes, in addition to the CMOS image sensor described in Embodiment 1 or 2 as a solid-state imaging element (solid-state imaging device) 42, a lens 41, an imaging circuit unit 43 which performs imaging processing based on a control signal from an AE (auto exposure) calculation/control unit 45, a timing generator 47 which controls the timing of the solid-state imaging element 42 and the AE calculation/control unit 45, an integration 48 which analyses a signal outputted from the imaging circuit unit 43 and the control signal from the AE calculation/control unit 45, a signal processing unit 44 which processes the signal outputted from the imaging circuit unit 43 using a control signal generated in an AWB (auto white balance) calculation/control unit 46 based on the signal from the integration 48, a display unit 49 which displays the signal outputted from the signal processing unit 44, and a recording unit 50 which records the signal outputted from the signal processing unit 44, therefore, the apparatus is capable of controlling the CMOS image sensor 42 properly, adding signal processing on the imaging signals thus obtained, and performing display and/or recording, as a result, high quality imaging results can be obtained easily.

According to a process generation, the minimum device isolation width and the minimum transistor width are determined. In order to perform miniaturization of pixels without changing the basic configuration and not advancing the process generation, there is no other choice but to reduce the area of photodiodes. Accordingly, the ratio of the area of the photodiode occupied in the unit pixel tends to be reduced, however, there is limitations for this. On the other hand, in the pixel sharing technology, in which the basic configuration is changed, and the amplifying transistor (AMP), the vertical selecting transistor (SEL) and the reset transistor (RST) are shared between adjacent unit pixels, the light receiving area for photodiode can be sufficiently secured by decreasing the number of transistors at each unit pixel. Even if the equality of intervals between photodiodes is lost when applying the pixel sharing technology because of minuteness of unit pixels, according to the embodiment of the invention, the pixel sharing technology will be applicable by changing optical paths of incident light into the photodiodes.

The invention has been explained according to the embodiments as the above, it goes without saying that the invention is not limited to these examples, and can be properly altered within the scope not departing from the gist of the invention.

For example, as a means for changing the optical paths of incident light, both a method of Embodiment 1 and a method of Embodiment 2 in the invention can be used. Specifically, a first optical path changing unit is formed by arranging the high refractive index material layer on the deviated photoelectric conversion regions, as well as by arranging the low refractive index material layer on the photoelectric conversion regions at the inverse side of the deviated direction, and a second light path changing unit is formed by arranging convex lenses at optical paths of incident light from the first changing unit, so that light axis positions are deviated in the same direction as the deviated direction from the central positions of the unit pixels.

The solid-state imaging device and the manufacturing method thereof and the imaging apparatus can be applied to a CMOS image sensor, an electronic camera and the like, which contributes to the prevention of deterioration of imaging characteristics such as deterioration of the amount of saturated signals and sensitivity.

The invention claimed is:

1. A solid-state imaging device in which plural unit areas, each having a photoelectric conversion region converting incident light into electric signals are provided adjacently, wherein each photoelectric conversion region is provided being deviated from the central position of each unit area to a boundary position between the plural unit areas,
wherein a high refractive index material layer is arranged over the deviated photoelectric conversion region, and a low refractive index material layer is provided over the photoelectric conversion region at the inverse side of the deviated direction, being adjacent to the high refractive index material layer, and
wherein optical paths of the incident light are changed by the high refractive index material layer and the low refractive index material layer, and incident light enters the photoelectric conversion region; and wherein the high refractive index material layer and the low refractive index material layer are provided between a passivation film on an insulating layer and a filter layer below an on-chip lens region.

2. The solid-state imaging device according to claim 1, wherein an output extraction region which is common to the plural photoelectric conversion regions is formed at the boundary position.

3. The solid-state imaging device according to claim 2, wherein charge transfer gates are formed between each of the plural photoelectric conversion regions and the common output extraction region.

4. The solid-state imaging device according to claim 1, wherein the plural unit areas have the same degree of deviation with one another.

5. The solid-state imaging device according to claim 4, wherein respective central positions of the high refractive index material layer and the low refractive index material layer exist on the boundary positions.

6. The solid-state imaging device according to claim 1, wherein the high refractive index material layer is made of silicon nitride material or titanium oxide dispersed polyimide.

7. The solid-state imaging device according to claim 1, wherein the low refractive index material layer is made of fluorinated polymer or silicon oxide material.

8. The solid-state imaging device according to claim 1, wherein the high refractive index material layer and the low refractive material layer are provided between an insulating layer in which wiring for transmitting output signals of the photoelectric conversion regions is embedded and an on-chip lens region.

9. An imaging apparatus, comprising:
the solid-state imaging device according to claim 1;
a signal processing unit which performs processing of output signals of the solid-state imaging device; and
a recording unit which records the output signals of the signal processing unit.

* * * * *